United States Patent
Moens et al.

(10) Patent No.: US 11,742,381 B2
(45) Date of Patent: Aug. 29, 2023

(54) MONOLITHIC SEMICONDUCTOR DEVICE ASSEMBLIES

(71) Applicant: SEMICONDUCTOR COMPONENTS INDUSTRIES, LLC, Phoenix, AZ (US)

(72) Inventors: Peter Moens, Erwetegem (BE); Gordon M. Grivna, Mesa, AZ (US); Yusheng Lin, Phoenix, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/948,801

(22) Filed: Oct. 1, 2020

(65) Prior Publication Data

US 2022/0020848 A1 Jan. 20, 2022

Related U.S. Application Data

(60) Provisional application No. 62/705,758, filed on Jul. 14, 2020.

(51) Int. Cl.
| | |
|---|---|
| *H01L 29/06* | (2006.01) |
| *H01L 25/07* | (2006.01) |
| *H01L 29/20* | (2006.01) |
| *H01L 21/762* | (2006.01) |

(52) U.S. Cl.
CPC .... *H01L 29/0649* (2013.01); *H01L 21/76224* (2013.01); *H01L 25/071* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 7,371,610 B1 * | 5/2008 | Fan | H01L 23/4334 257/E23.092 |
| 8,933,473 B1 * | 1/2015 | Dubin | H01L 21/486 257/79 |

(Continued)

FOREIGN PATENT DOCUMENTS

EP   2075825 A1   7/2009

OTHER PUBLICATIONS

Hichr et al.; "Excimer Laser Ablation for Microvia and Fine RDL Routings for Advanced Packaging"; Chip Scale Review; Sep.-Oct. 2017; pp. 1 to 4.

(Continued)

*Primary Examiner* — Khaja Ahmad
(74) *Attorney, Agent, or Firm* — Brake Hughes Bellermann LLP

(57) ABSTRACT

In a general aspect, a semiconductor device assembly can include a semiconductor substrate that excludes a buried oxide layer. The semiconductor device assembly can also include a first semiconductor device stack disposed on a first portion of the semiconductor substrate, and a second semiconductor device stack disposed on a second portion of the semiconductor substrate. The semiconductor device assembly can further include an isolation trench having a dielectric material disposed therein, the isolation trench being disposed between the first portion of the semiconductor substrate and the second portion of the semiconductor substrate. The isolation trench can electrically isolate the first portion of the semiconductor substrate from the second portion of the semiconductor substrate.

16 Claims, 14 Drawing Sheets

(56) References Cited

U.S. PATENT DOCUMENTS

| | | | |
|---|---|---|---|
| 10,090,199 | B2 | 10/2018 | Grivna et al. |
| 2003/0032216 | A1 | 2/2003 | Nakaoka et al. |
| 2008/0179611 | A1* | 7/2008 | Chitnis ............... H01L 33/62 257/E33.061 |
| 2010/0006864 | A1 | 1/2010 | Steigerwald |
| 2011/0241054 | A1* | 10/2011 | Lee ................. H01L 27/153 257/E33.068 |
| 2012/0273751 | A1* | 11/2012 | Chang ............... H01L 33/405 257/E33.072 |
| 2014/0210054 | A1 | 7/2014 | Kosub et al. |
| 2014/0252375 | A1* | 9/2014 | Briere ............ H01L 21/02422 257/77 |
| 2018/0033669 | A1 | 2/2018 | Salih et al. |
| 2018/0247869 | A1* | 8/2018 | Zechmann ......... H01L 29/0649 |
| 2019/0035687 | A1 | 1/2019 | Grivna et al. |
| 2019/0051762 | A1* | 2/2019 | Yu ..................... H01L 33/54 |
| 2019/0063848 | A1* | 2/2019 | Miller .................. F28F 13/06 |
| 2020/0020825 | A1* | 1/2020 | Yang ................... H01L 33/12 |

OTHER PUBLICATIONS

Lerner et al.; "Integration of GaN HEMTs onto Silicon CMOS by Micro Transfer Printing"; Proc. of the 2016 28th Int'l Symp. on Power Semiconductor Devices and ICs; IEEE; 2016; pp. 451-454.

Hanft et al.; "An Overview of the Aerosol Deposition Method: Process Fundamentals and New Trends in Materials Applications"; J. Ceram. Sci. Tech.; vol. 6, No. 3; 2015; pp. 147-182.

Strothmann et al.; "Encapsulated Wafer Level Package Technology (eWLCSP)"; 2014 Electronic Components and Technology Conference Proceedings; IEEE; 2014; pp. 931-934.

Gingerella; Excimer Laser Via-Drilling—Options to Further Capabilities of Next Generation Wafer Level Processing Devices; SUSS Report; SUSS MicroTec Photonic Systems Inc.; 2014; pp. 1 to 5.

Shahien et al.; "In Situ Fabrication of AlN Coating by Reactive Plasma Spraying of Al/AlN Powder"; Coatings; 2011; pp. 88 to 107.

Chung et al.; "GaN-on-Si Technology, a New Approach for Advanced Devices in Energy and Communications" Proc. of the European Solid-State Device Research Conference 2010; IEEE; 2010; pp. 52-56.

Chumbes et al.; "AlGaN/GaN High Electron Mobility Transistors on Si(111) Substrates"; IEEE Trans. on Electronic Devices; IEEE; 2001; pp. 420-426.

Xiangdong Li et al., "200 V Enhancement-Mode p-GaN HEMTs Fabricated on 200 mm GaN-on-SOI With Trench Isolation for Monolithic Interation", IEEE Electron Device Letters, vol. 38, No. 7, Jul. 2017.

Gordon M. Grivna, "Electronic Device Including a Polymer Support Layer and a Process of Forming the Same", U.S. Appl. No. 16/661,776, filed Oct. 23, 2019.

* cited by examiner

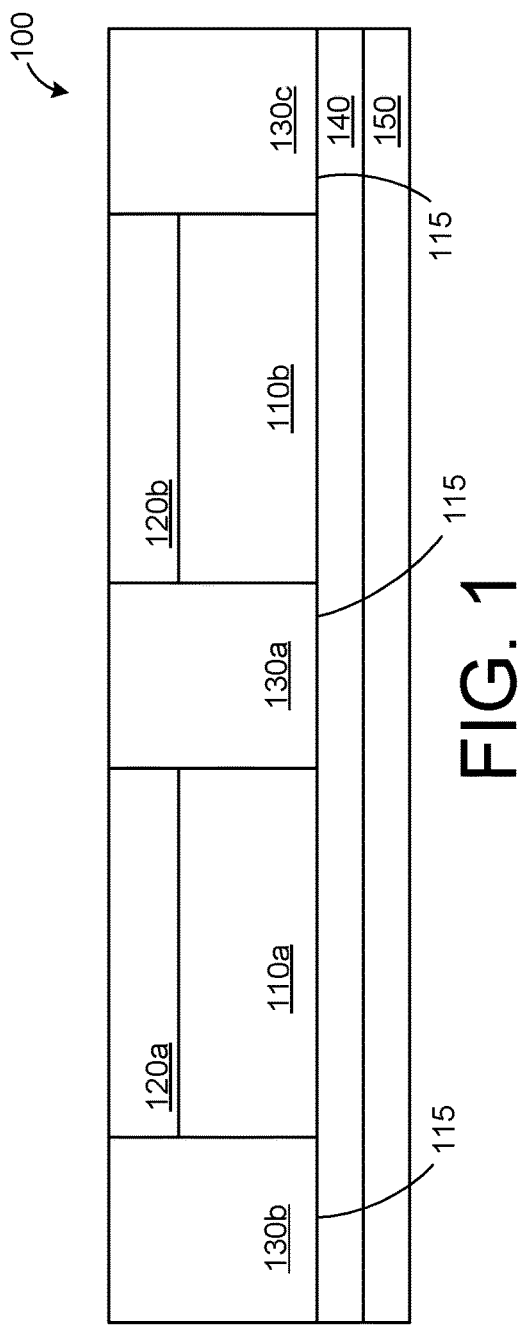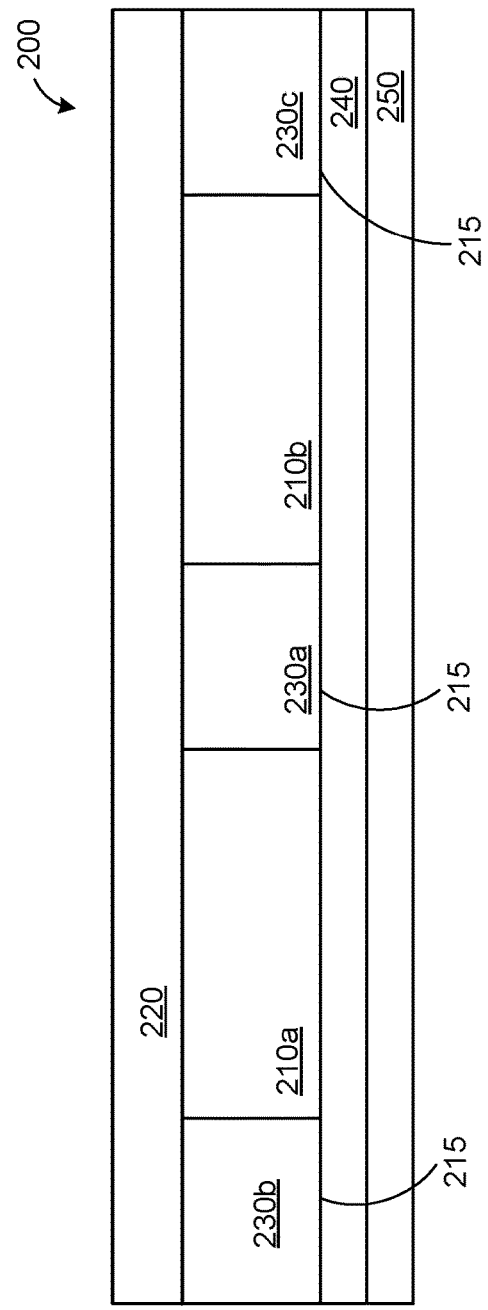

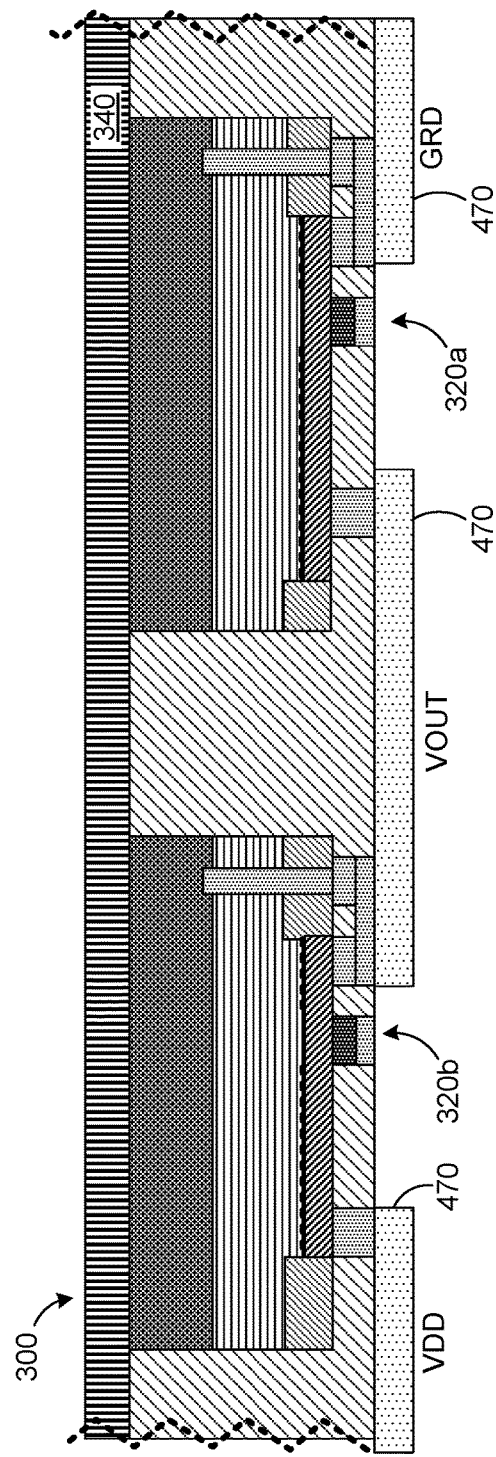
FIG. 4A
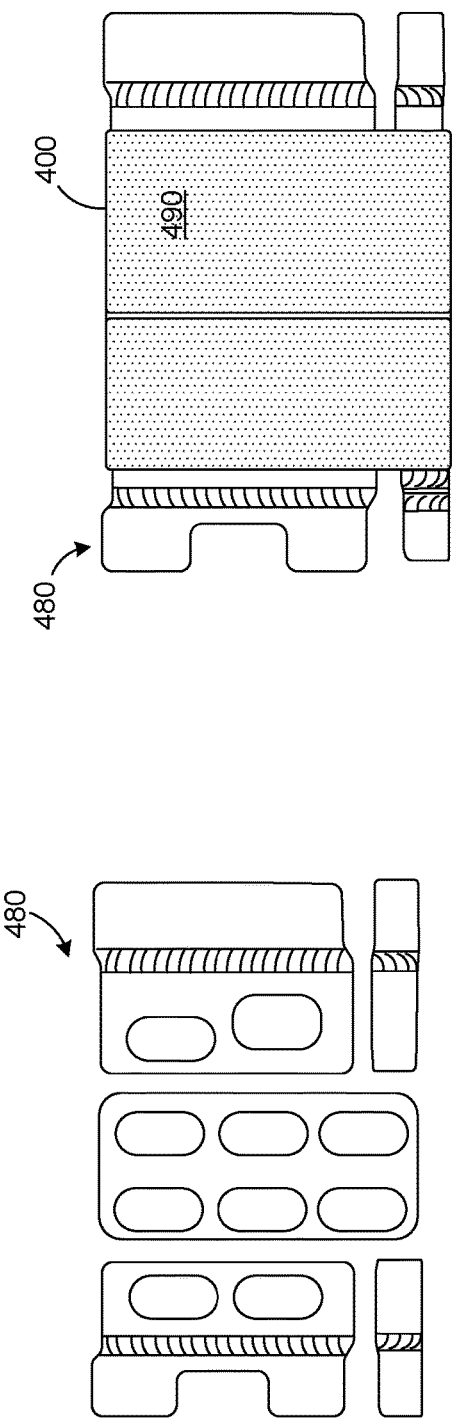
FIG. 4B
FIG. 4C

MONOLITHIC SEMICONDUCTOR DEVICE ASSEMBLIES

CROSS-REFERENCE TO RELATED APPLICATIONS

This application claims the benefit of U.S. Provisional Patent Application No. 62/705,758, filed on Jul. 14, 2020, the entire contents of which is incorporated herein by reference.

TECHNICAL FIELD

This description relates to semiconductor device assemblies, and associated methods of manufacture. More specifically, this description relates to semiconductor device assemblies that include monolithically integrated semiconductor devices that are isolated from one another using isolation trenches.

BACKGROUND

Semiconductor devices can be implemented in a semiconductor device assembly. For example, multiple semiconductor devices can be monolithically implemented in a single semiconductor device assembly, such as multiple power transistors (e.g., in a half-bridge circuit, a full bridge circuit, etc.). In some implementations, passive devices (such as capacitors, inductors, resistors, etc.) can also be monolithically integrated in a semiconductor device. However, interference between monolithically integrated devices can occur, such as between devices implemented in a common semiconductor substrate. For instance, in half-bridge circuits implemented using gallium-nitride (GaN) on silicon (Si) transistors, negative back-bias can occur on a high-side switch when the high-side switch is on (conducting). This negative back bias can adversely affect (increase) on-resistance of the high-side switch. In other implementations, similar adverse effects can occur as a result of interference between monolithically implemented (active and/or passive) devices.

Current approaches for preventing such interference include using silicon-on-insulator (SOI) technologies to isolate monolithically integrated devices from one another. Such SOI technologies are, however, expensive, both in material costs (e.g., SOI wafers) and processing costs (e.g., manufacturing costs to produce semiconductor devices on SOI wafers). Further, buried oxide layers included in SOI wafers have poor thermal conductivity, which is undesirable for providing efficient heat dissipation in power semiconductor devices.

SUMMARY

In a general aspect, a semiconductor device assembly can include a semiconductor substrate that excludes a buried oxide layer. The semiconductor device assembly can also include a first semiconductor device stack disposed on a first portion of the semiconductor substrate, and a second semiconductor device stack disposed on a second portion of the semiconductor substrate. The semiconductor device assembly can further include an isolation trench having a dielectric material disposed therein, the isolation trench being disposed between the first portion of the semiconductor substrate and the second portion of the semiconductor substrate. The isolation trench can electrically isolate the first portion of the semiconductor substrate from the second portion of the semiconductor substrate.

In another general aspect, a semiconductor device assembly can include a first portion of a semiconductor substrate, and a second portion of the semiconductor substrate. The semiconductor substrate can exclude a buried oxide layer. The semiconductor device assembly can also include a first semiconductor device stack disposed on the first portion of the semiconductor substrate, and a second semiconductor device stack disposed on the second portion of the semiconductor substrate. The semiconductor device assembly can further include an isolation trench having a dielectric material disposed therein. The isolation trench can be disposed between the first portion of the semiconductor substrate and the second portion of the semiconductor substrate; and between the first semiconductor device stack and the second semiconductor device stack. The isolation trench can electrically isolate the first portion of the semiconductor substrate from the second portion of the semiconductor substrate. The isolation trench can also electrically isolate the first semiconductor device stack from the second semiconductor device stack.

In another general aspect, a semiconductor device assembly can include a first portion of a semiconductor substrate, and a second portion of the semiconductor substrate. The semiconductor substrate can exclude a buried oxide layer. The semiconductor device assembly can include a semiconductor device layer disposed on the first portion of the semiconductor substrate and the second portion of the semiconductor substrate. The semiconductor device layer can include a first semiconductor device disposed on the first portion of the semiconductor substrate, and a second semiconductor device disposed on the second portion of the semiconductor substrate. The semiconductor device assembly can also include an isolation trench having a dielectric material disposed therein. The isolation trench can be disposed between the first portion of the semiconductor substrate and the second portion of the semiconductor substrate. The isolation trench can electrically isolate the first portion of the semiconductor substrate from the second portion of the semiconductor substrate. The semiconductor device layer can exclude the isolation trench.

BRIEF DESCRIPTION OF THE DRAWINGS

FIGS. 1 and 2 are diagrams schematically illustrating cross-sectional views of respective semiconductor device assemblies.

FIG. 4A is a diagram schematically illustrating a cross-sectional view of a semiconductor device assembly that is a flip-chip implementation of the semiconductor assembly of FIG. 3.

FIG. 4B is a diagram illustrating conductive clips that can be used in conjunction with the assembly of FIG. 3A.

FIG. 4C is a diagram schematically illustrating an assembly including the semiconductor device assembly of FIG. 4A and the conductive clips of FIG. 4B.

Figure 3:
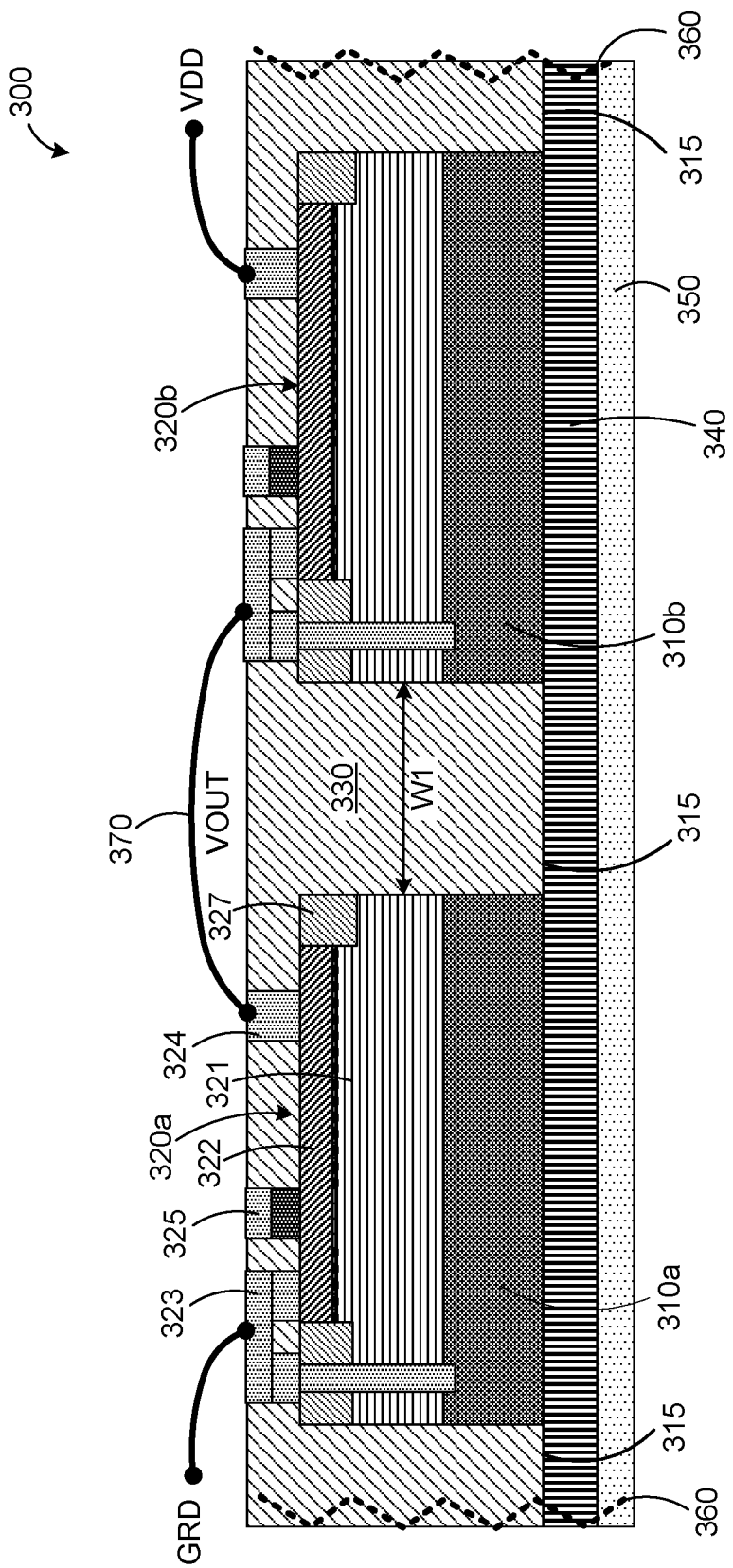
FIG. 3 is a diagram schematically illustrating a cross-sectional view of a semiconductor device assembly that can implement the semiconductor device assembly of FIG.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to semiconductor device assemblies (assemblies) that include monolithically integrated semiconductor devices, where the semiconductor devices are implemented on a semiconductor substrate that excludes a buried oxide layer, (e.g., silicon on insulator wafers). As described herein, such monolithically implemented semiconductor devices can be isolated (electrically isolated) from each other in an assembly using isolation trenches that have a dielectric material (e.g., molding compound used to overmold the assembly, or other dielectric material) disposed therein. Such implementations can have reduced (material and manufacturing) cost, as well as improved thermal dissipation efficiency, as compared to corresponding assemblies using SOI (or similar) technologies.

While the implementations described herein are generally discussed with respect to assemblies that include gallium-nitride (GaN) on silicon (Si) transistors (e.g., in half-bridge circuit configurations), the approaches described herein can be implemented in conjunction with other semiconductor technologies (e.g., Si, gallium-arsenide (GaAs), silicon-germanium (SiGe), silicon-carbide (SiC), gallium oxide ($Ga_2O_3$), etc., as well as in conjunction with other semiconductor devices, such as metal-oxide semiconductor transistors, bipolar transistors, insulated-gate bipolar transistors (IGBTs), diodes, and/or passive device, as some examples. Accordingly, in the examples described herein, a semiconductor device stack and/or a semiconductor device layer can implement semiconductor devices other than those specifically discussed in the various examples.

FIGS. 1 and 2 are diagrams schematically illustrating cross-sectional views of respective semiconductor device assemblies 100 and 200. As shown in FIG. 1, the assembly 100 includes a first portion of a semiconductor substrate (first substrate portion) 110a and a second portion of the semiconductor substrate (second substrate portion) 110b. The semiconductor substrate can be a semiconductor substrate that excludes a buried oxide layer, such as the various semiconductor substrates described herein. The assembly 100 of FIG. 1 also includes a first semiconductor device stack 120a that is disposed on the first substrate portion 110a and a second semiconductor device stack 120b that is disposed on the second substrate portion 120b. The device stacks 120a and 120b can each include one or more respective semiconductor devices, such as those described herein.

Figure 7A:
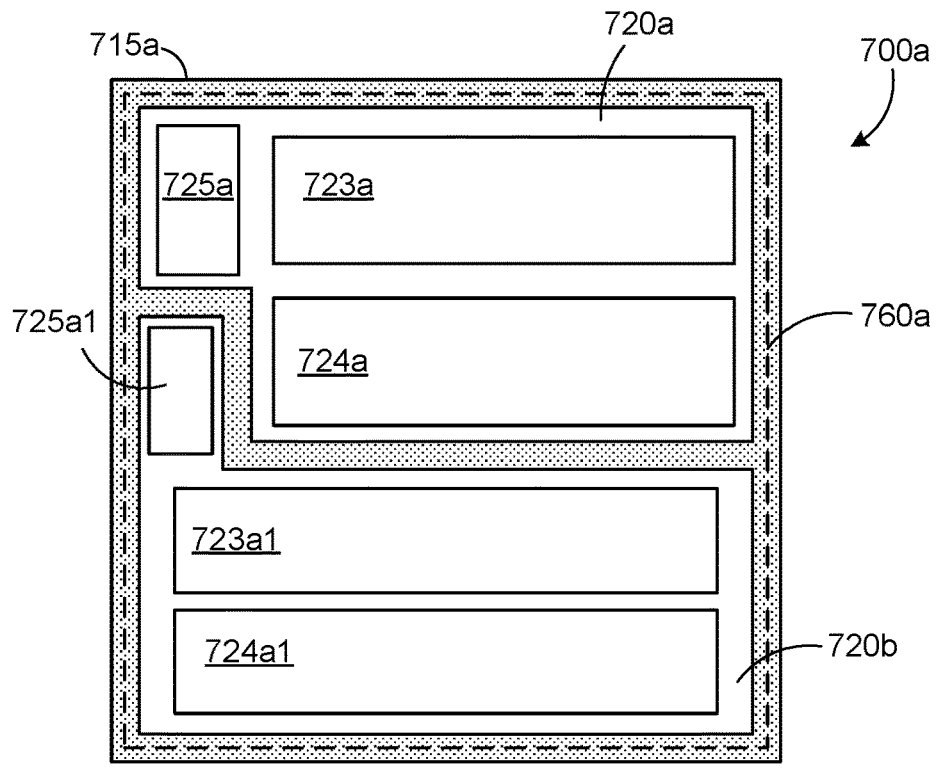
FIGS. 7A and 7B are diagrams schematically illustrating isolation trench layouts in semiconductor device assemblies.
Figure 7B:
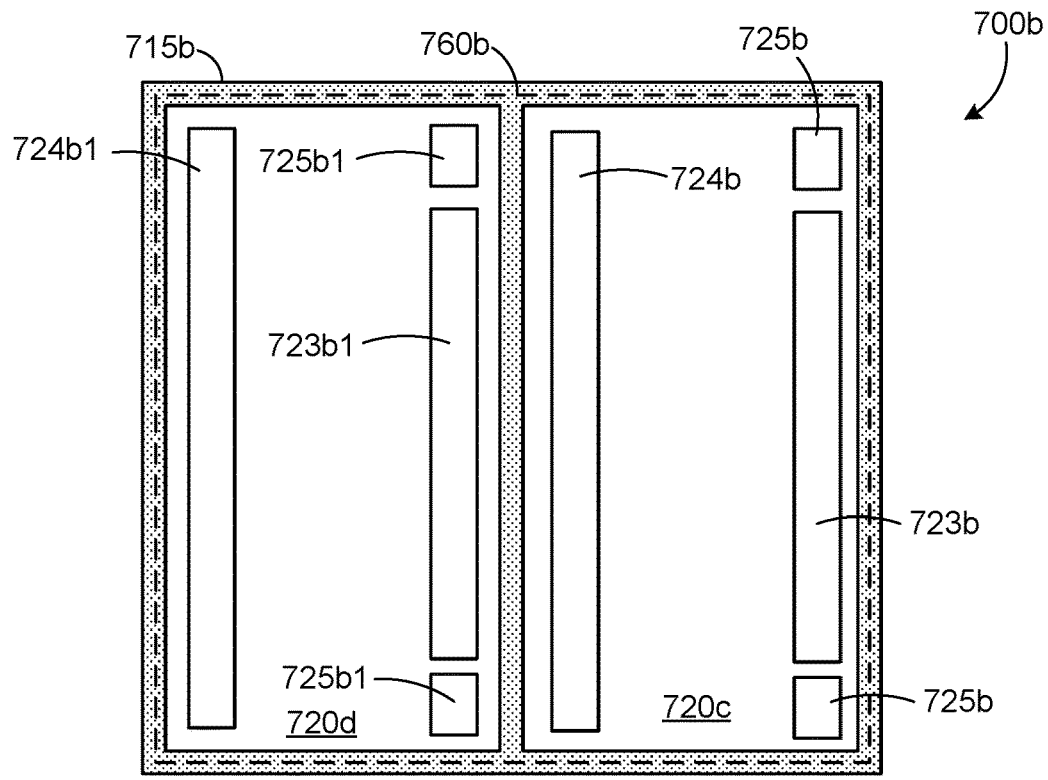

As shown in FIG. 1, the assembly 100 can also include an isolation trench 115 that is disposed between, and isolates (electrically isolates) the first substrate portion 110a from the second substrate portion 110b. In the assembly 100, the isolation trench 115 is also disposed between and isolates the device stack 120a from the device stack 120b. The isolation trench 115, in this example, also can surround the first substrate portion 110a and the device stack 120a, as well as surround the second substrate portion 110b and the device stack 120b. Example arrangements (e.g., top plan views) of isolation trenches are shown in FIGS. 7A and 7B.

The assembly 100 can also include dielectric material 130a, dielectric material 130b and dielectric material 130c that are disposed in respective portions of the isolation trench 115. Depending on the implementation, the dielectric materials 130a, 130b and 130c can be a same dielectric material, or can be different dielectric materials. For instance, in some implementations, the dielectrics materials 130a, 130b and 130c can include a molding compound that is used to overmold (e.g., compression mold) the assembly 100. In such approaches, portions of the molding compound 130 can also be disposed on the device stacks 120a and 120b, such as is the example implementations described herein. Such overmolding, in addition to providing isolation (e.g., provided by the molding compound that is disposed in the isolation trench 115), can also provide structural support to the assembly 100, which can allow for thinning of the substrate portions 110a and 110b, resulting reduced thickness of the assembly and/or improved thermal dissipation efficiency (e.g., as a result of reduced thermal resistance). Example implementations of the assembly 100 are shown, e.g., in FIGS. 3, 4A and 6. Further an example manufacturing process flow for producing an implementation of the assembly 100 is illustrated in FIGS. 9A-9H (in conjunction with FIG. 8).

The assembly 100 also includes a thermally conductive dielectric material (layer) 140 that is disposed on coplanar, respective surfaces of the first substrate portion 110a, the second substrate portion 110b, and the dielectric materials 130a, 130 and 130c. In some implementations, the dielectric material 140 can include, e.g., a ceramic material (e.g., a nitride ceramic), a diamond coat, a mold compound layer (e.g., produced using a compression overmolding process), etc. In some implementations, a nitride ceramic (nitride or ceramic material) of the dielectric material 140 can include silicon nitride (SiN), aluminum nitride (AlN), boron nitride (BN), etc. In some implementations, the dielectric material can include an organic material, such as a polyimide, a thermally conductive polymer, etc.

The example assembly 100, as shown in FIG. 1, further includes a thermally conductive material 150 disposed on the dielectric material 140. In some implementations, the thermally conductive material 150 can include a solder material, a heat slug, and/or a heat sink (or other thermal dissipation appliance, such as a cooling jacket). For purposes of this disclosure, the dielectric material 140 and the thermally conductive material 150 can be referred to as being disposed (arranged, situated, located, etc.) on a back side or bottom side of the assembly 100, while the device stacks 120a and 120b can be referred to as being disposed (arranged, situated, located, etc.) on a front side or top side of the assembly 100. In other implementations, other arrangements are possible.

The assembly 200 of FIG. 2 is similar to the assembly 100 of FIG. 1, and such similarities, as well as differences between the assemblies 100 and 200, may be noted in the following discussion. As shown in FIG. 2, the assembly 200 includes a first portion of a semiconductor substrate (first substrate portion) 210a and a second portion of the semiconductor substrate (second substrate portion) 210b. As with the semiconductor substrate of the assembly 100, the semiconductor substrate of the assembly 200 can be a semiconductor substrate that excludes a buried oxide layer.

As compared to the semiconductor device stacks 120a and 120b of FIG. 1, the assembly 200 can include a semiconductor device layer 220, in which multiple semiconductor devices can be implemented (e.g., such as the various semiconductor devices discussed above). For instance, in an example implementation, the semiconductor device layer 220 can include a first semiconductor device (e.g., a first semiconductor device stack of the device layer 220) that is disposed on (above, vertically aligned with, etc.) the first substrate portion 210a and a second semiconductor device (e.g., a first semiconductor device stack of the device layer 220) that is disposed on (above, vertically aligned with, etc.) the second substrate portion 220b.

As shown in FIG. 2, the assembly 200 can also include an isolation trench 215 that is disposed between and isolates (electrically isolates) the first substrate portion 210a from the second substrate portion 210b. As compared to the isolation trench 115 of FIG. 1, the isolation trench 215 is excluded from the semiconductor device layer 220 (e.g., does not extend into the semiconductor device layer 220, and/or between semiconductor devices or semiconductor device stacks). The isolation trench 215, in this example, can surround the first substrate portion 210a and the device stack 220a (but not surround semiconductor device stacks). In some implementations, the isolation trench 215 can be formed from a back side (bottom side) of the semiconductor substrate of the assembly 200 (e.g., so as to define the first portion 210a and the second substrate portion 210b), while the isolation trench 115 of the assembly 100 can be formed from the front side (top side) of the semiconductor substrate of the assembly 100.

The assembly 200 can also include dielectric material 230a, dielectric material 230b and dielectric material 230c that are disposed in respective portions of the isolation trench 215. As with the assembly 100, depending on the implementation, the dielectric materials 230a, 230b and 230c can be a same dielectric material, or can be different dielectric materials. For instance, in some implementations, the dielectrics materials 230a, 230b and 230c can include a molding compound that is used to overmold (e.g., compression mold) a back side (bottom side) of the assembly 200, or can be a molding compound that formed and then planarized to have surfaces (of the dielectric materials 230a, 230b and 230c) that are coplanar with respective back side (bottom side) surfaces of the first substrate portion 210a and the second substrate portion 210b.

While not specifically shown in FIG. 2, similar to the assembly 100, the assembly 200 can be over molded on a front side (top side) of the assembly 200 (e.g., the semiconductor device layer 220 can be overmolded). Such front side overmolding can provide structural support to the assembly 200, which can allow for thinning of the substrate portions 210a and 210b (e.g., prior to forming the isolation trench 215), allowing for reduced assembly thickness and/or improved thermal dissipation efficiency (e.g., as a result of reduced thermal resistance). An example implementation of the assembly 200 is shown, e.g., in FIG. 5. Further an example manufacturing process flow for producing an implementation of the assembly 200 is illustrated in FIGS. 10A-10F (in conjunction with FIG. 8).

As with the assembly 100, the assembly 200 also includes a thermally conductive dielectric material 240 that is disposed on respective coplanar surfaces of the first substrate portion 210a, the second substrate portion 210b, and the dielectric materials 230a, 230b and 230c. The dielectric material 240 can include, e.g., a ceramic material (e.g., a nitride ceramic), a diamond coat, a mold compound, etc.). As with the assembly 100, the assembly 200 further includes a thermally conductive material 250 disposed on the dielectric material 240. In some implementations, the thermally conductive material 250 can include a solder, a heat slug, and/or a heat sink (or other thermal dissipation appliance, such as a cooling jacket).

FIG. 3 is a diagram schematically illustrating a cross-sectional view of a semiconductor device assembly 300 that can implement the semiconductor device assembly of FIG. 1. The assembly 300, by way of example, includes a half-bridge circuit implemented using GaN on Si transistors. As noted above, the approaches described herein can be used in connection with providing isolation between any number of monolithically integrated semiconductor devices (e.g., implemented using various semiconductor technologies). Accordingly, the elements of the GaN on Si transistors of FIG. 3 are described by way of example and for purposes of context.

The assembly 300 includes a first portion of a semiconductor substrate (first substrate portion) 310a and a second portion of the semiconductor substrate (second substrate portion) 310b. In this example, the semiconductor substrate can be implemented using a Si substrate with a 111 crystal orientation, suitable for implementing GaN on Si transistors. As shown in FIG. 3, the assembly 300 includes a first GaN transistor 320a (e.g., a low-side switch of a half-bridge circuit) in a first device stack, and a second GaN transistor 320b (e.g., a high-side switch of the half-bridge circuit) in a second device stack. The semiconductor substrate (111-orientation Si) can exclude a buried oxide layer.

In the assembly 300, the transistor 320a is disposed on the first substrate portion 310a and the transistor 320b is disposed on the second substrate portion 310b. As the transistors 320a and 320b of the assembly 300 are of like structure, for purposes of brevity, only the elements of the transistor 320a are described.

As shown in FIG. 3, the GaN transistor 320a includes a GaN layer 321 and an aluminum gallium nitride (AlGaN) layer 322. In such implementations, the composition of the GaN layer 322 can vary between AlN (100% Al) and $Al_{0.1}Ga_{0.9}N$ (10% Al). The transistor 320a further includes a source terminal 323, a drain terminal 324 and a gate terminal 325. As shown in FIG. 3, the source terminal 323 is electrically coupled with the first substrate portion 310a through a contact (a sinker, etc.) 326, so that the first substrate portion 310a is at the electrical potential of the source terminal 323 during operation of the half-bridge circuit. In the assembly 300, the GaN transistor 320a also includes isolation implants 327.

As also shown in FIG. 3, the assembly 300 includes an isolation trench 315 (having a width W1) that is disposed between, and isolates (electrically isolates) the first substrate portion 310a from the second substrate portion 310b. In some implementations, the width W1 can be in a range of 10-100 microns (μm). In the assembly 300, the isolation trench 315 is also disposed between and isolates the transistor 320a device stack from the transistor 320b device stack. The isolation trench 315, in this example, as in the assembly 100, also surrounds the first substrate portion 310a and the transistor 320a device stack, as well as surrounds the second substrate portion 310b and the transistor 320b device stack.

As illustrated in FIG. 3, the assembly 300 also includes dielectric material 330 (e.g., molding compound applied using a front side compression molding operation) that is disposed in the various portions of the isolation trench 315, as well as on portions of respective top side (front side) surfaces of the device stacks including the transistors 320a and 320b. As noted above, such overmolding, in addition to providing isolation (e.g., provided by the molding compound 300 that is disposed in the isolation trench 315), can also provide structural support to the assembly 300, which can allow for thinning of the substrate portions 310a and 310b (e.g., to a thickness T1 of approximately 50 μm). This reduced thickness can reduce an overall thickness of the assembly 300 and/or improved thermal dissipation efficiency (e.g., as a result of reduced thermal resistance).

As with the assembly 100, the assembly 300 also includes a thermally conductive dielectric material (layer) 340 that is disposed on coplanar, respective back side (bottom side) surfaces of the first substrate portion 310a, the second substrate portion 310b, and the dielectric material 330. In some implementations, as described herein, the dielectric material 340 can include, e.g., a ceramic material (e.g., a nitride ceramic), a diamond coat, a mold compound layer (e.g., produced using a compression overmolding process), etc.

Also, as with the assembly 100, the assembly 300, as shown in FIG. 3, further includes a thermally conductive material 350 disposed on the dielectric material 340. In some implementations, the thermally conductive material 350 can include a solder material, a heat slug, and/or a heat sink (or other thermal dissipation appliance, such as a cooling jacket).

As is also shown in FIG. 3, the assembly 300 can be singulated (e.g., separated from a wafer, separated from other assemblies, etc.) along cut lines 360. Such singulation can be accomplished using a saw, a laser, plasma etching, etc. Examples of top (plan) view cut lines are illustrated in FIGS. 7A and 7B. In this example, the assembly 300 also include wire bond connections 370, that provides electrical connections of the half bridge circuit for electrical ground (GRD), an output voltage terminal (VOUT) and a power supply (VDD).

FIG. 4A is a diagram schematically illustrating a cross-sectional view of a semiconductor device assembly 400 that is a flip-chip implementation of the semiconductor assembly of FIG. 3. Accordingly, the details of the assembly 300 discussed above with respect to FIG. 3 are not repeated again here. As shown in FIG. 4A, as compared to FIG. 3, the assembly 300 (shown inverted from the orientation of FIG. 3) is modified, to replace the wire bond connections 370 with chip-scale package signal routing traces 470, to allow the assembly 400 to be used in a flip-chip implementation. For instance, the assembly 400 of FIG. 4A can be coupled with the conductive clip arrangement 480 shown in FIG. 4B to produce the assembly of FIG. 4C. As shown in FIG. 4C, a heat sink 490 (or other thermal dissipation appliance) can be coupled (connected, attached, affixed, mounted, etc.) to the thermally conductive dielectric layer 340 of the assembly 400. Accordingly, the assembly shown in FIG. 4C, the assembly 400 of FIG. 4A is disposed between, and coupled with the conductive clips 480 and the heat sink 490.

Figure 5:
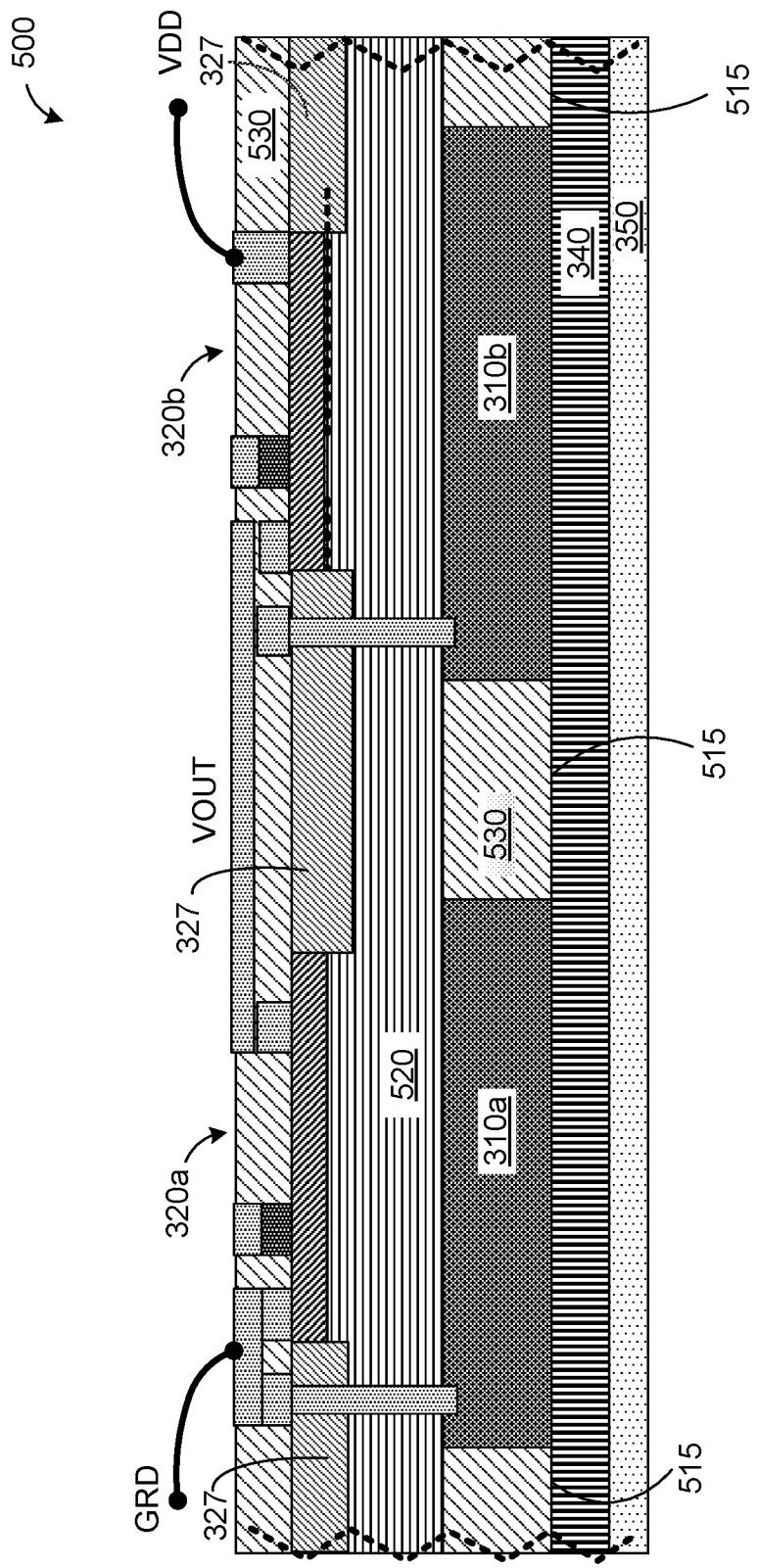
FIG. 5 is a diagram schematically illustrating a cross-sectional view of a semiconductor device assembly that can implement the semiconductor device assembly of FIG. 2.

FIG. 5 is a diagram schematically illustrating a cross-sectional view of a semiconductor device assembly 500 that can implement the semiconductor device assembly of FIG. 2. As shown in FIG. 5, the assembly 500 includes similar aspects as the assembly 300. Accordingly, as with reference to the assembly 400 of FIG. 4, 300 series reference numbers corresponding with elements of the assembly 300 are included in FIG. 5 for context. As can be seen in FIG. 5, as compared with FIG. 3, the transistors 320a and 320b, rather than being implemented in isolated device stacks, are implemented on a common (continuous, etc.) semiconductor device layer 520 (e.g., a GaN/AlGaN stack in this example). In this example implementation, layer 520 can be unintentionally doped, hence electrically insulating. For instance, in some implementations, layer 520 can have a free carrier concentration (electron or hole) below $1 \times 10^{16}$ cm$^{-3}$. In such implementations, a conductive two-dimensional electron gas (2DEG) at an interface of the AlGaN and GaN layers can be interrupted by the isolation implants 327. The assembly 500 includes an isolation trench 515 that has a dielectric material 530 disposed therein. As shown in FIG. 5, the isolation trench 515 (as with the isolation trench 315 of FIG. 3) is disposed between, and isolates (electrically isolates) the first substrate portion 310a from the second substrate portion 310b, and surrounds the first substrate portion 310a, as well as surround the second substrate portion 310b. Depending on the implementation, the dielectric material 530 can be a molding compound, or other dielectric, such as a nitride ceramic, a deposited oxide, etc. Also, a width of the dielectric material 530 of the assembly 500 between the first substrate portion 310a and the second substrate portion 310b will depend on the particular implementation.

As illustrated in FIG. 5, the semiconductor device layer 520 excludes the isolation trench 515 (e.g., the isolation trench 515 does not extend into the semiconductor device layer). As also shown in FIG. 5, the transistor 320a in the assembly 500 is disposed on (above, vertically aligned with, etc.) the first substrate portion 310a, while the transistor 320b is disposed on (above, vertically aligned with, etc.) the second substrate portion 310b. As shown in the manufacturing process flow of FIGS. 10A-10F, the isolation trench 515 can be formed from a back side (bottom side) of the assembly 500 (back side of a semiconductor substrate). As also shown in FIG. 5, as compared with FIG. 3, wire bonds 370 for the VOUT connection of the assembly can be replaced with direct metal routing 570 between a drain terminal of the transistor 320a and a source terminal of the transistor 320b (e.g., for connection to a VOUT terminal of the assembly 500).

Figure 6:
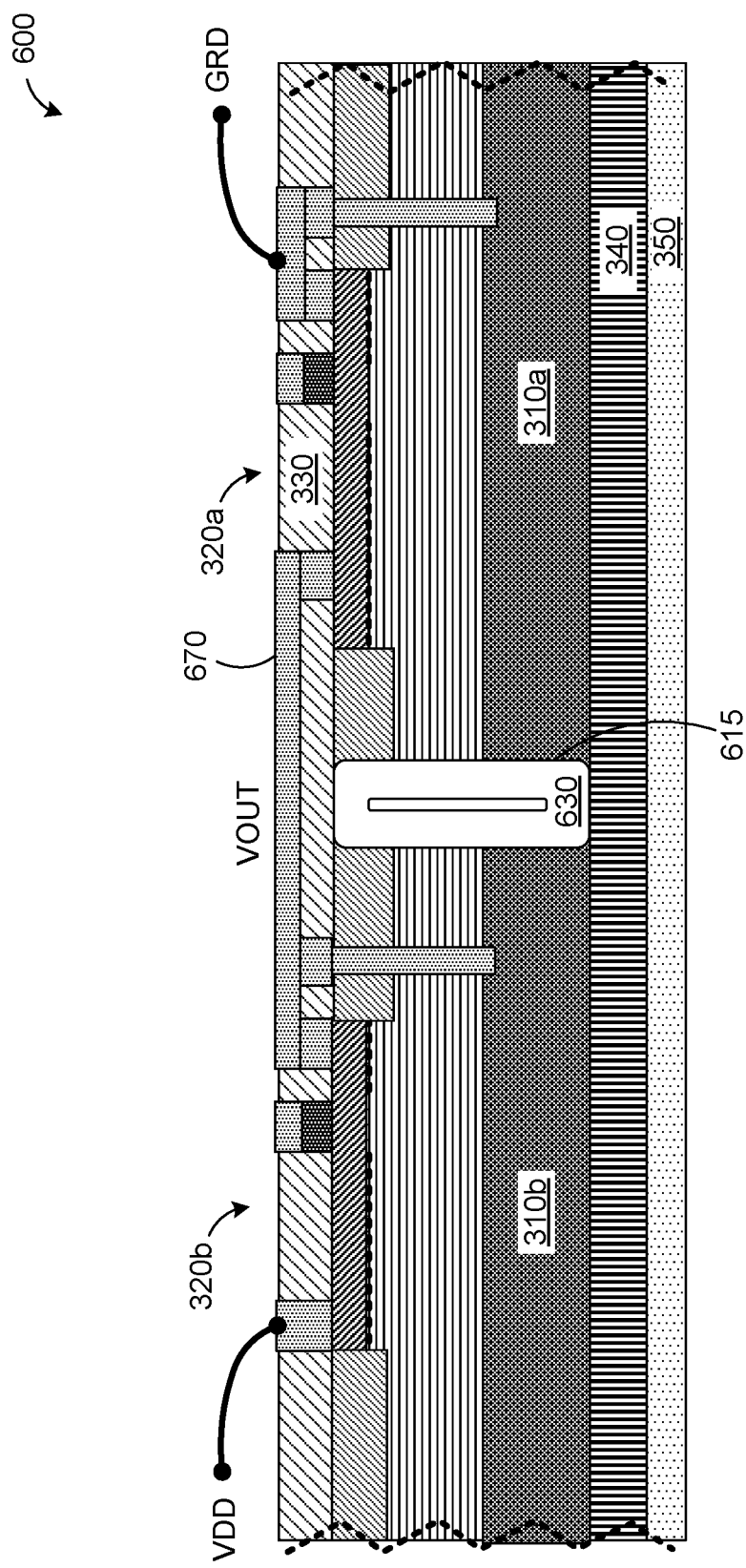
FIG. 6 is a diagram schematically illustrating a cross-sectional view of another semiconductor device assembly that can implement the semiconductor device assembly of FIG. 1.

FIG. 6 is a diagram schematically illustrating a cross-sectional view of another semiconductor device assembly 600 that can implement the semiconductor device assembly 100 of FIG. 1. As with the device assemblies 400 of FIG. 4A and 500 of FIG. 5, the assembly 600 includes similar aspects as the assembly 300 of FIG. 3. Accordingly, as with reference to the assemblies 400 and 500, 300 series reference numbers corresponding with elements of the assembly 300 are included in FIG. 6 for context. It is noted that the left-to-right arrangement of the transistors 320a and 320b in FIG. 6 is reversed from the arrangement shown in FIG. 3.

As compared with FIG. 3, in the assembly 600, an isolation trench 615 (e.g., disposed between the first substrate portion 310a and the second substrate portion 310b, and disposed between the transistor 320a device stack and the transistor 320b device stack) can have a dielectric 630 disposed therein. The dielectric 630, as compared with the assembly 300, can be different than the molding compound 330 that is used to overmold a front side (top side) surface of the assembly 600. In some implementations, the dielectric 630 can include a deposited silicon oxide, a deposited silicon nitride, a nitride ceramic material, a different molding compound, a molding compound that is applied separately from the molding compound 330, etc. As shown in FIG. 6, similar to the assembly 500, the assembly 600 can also include direct metal routing 670 (in place of wire bonds) between a drain terminal of the transistor 320a and a source terminal of the transistor 320b (e.g., for connection to a VOUT terminal of the assembly 600). Similar to the assemblies 300 and 400, the assembly 600 can be produced using the example manufacturing process shown in FIGS. 9A-9H, which is discussed further below.

FIGS. 7A and 7B are diagrams schematically illustrating isolation trench layouts (e.g., plan view) in respective semiconductor device assemblies 700a and 700b. In this example, the assemblies 700a and 700b, as with the assemblies 300, 400, 500 and 600, can include two transistors, which can be configured to implement a half-bridge circuit. In some implementations, other semiconductor devices can be implemented in the assemblies 700a and 700b (or in other assemblies implementing the approaches described herein).

As shown in FIG. 7A, the assembly 700b includes a transistor 720a (e.g., low-side switch) with a source pad (terminal) 723a, a drain pad (terminal) 724a and a gate pad (terminal) 725a, and also includes a transistor 720b (e.g., high-side switch) with a source pad (terminal) 723a1, a drain pad (terminal) 724a1 and a gate pad (terminal) 725a1. The assembly 700a also includes an isolation trench 715a that can be implemented using the approaches described herein. As can be seen in FIG. 7A, the portion of the isolation trench 715a between the transistor 720a and 720b can be irregular (e.g., not a straight line), which can, in some implementations, allow for more efficient placement (layout) of elements of the transistors 720a and 720b. In FIG. 7A, a dashed line 760a indicates a singulation (cut line), where the assembly 700a can be singulated from (separated from) a wafer, other semiconductor device assemblies, etc., e.g., through portions of the isolation trench 715a. For instance, a saw, a laser or a plasma etch can be used to singulate the assembly 700a along the line 760a.

As shown in FIG. 7B, the assembly 700b includes a transistor 720c (e.g., low-side switch) with a source pad (terminal) 723b, a drain pad (terminal) 724b and gate pads (terminals) 725b, and also includes a transistor 720d (e.g., high-side switch) with a source pad (terminal) 723b1, a drain pad (terminal) 724b1 and gate pads (terminals) 725b1. The assembly 700b also includes an isolation trench 715b that can be implemented using the approaches described herein. In FIG. 7B, a dashed line 760b indicates a singulation (cut line), where the assembly 700b can be singulated from (separated from) a wafer, other assemblies, etc., e.g., through portions of the isolation trench 715b. For instance, a saw, a laser or a plasma etch can be used to singulate the assembly 700b along the line 760b.

Figure 8:
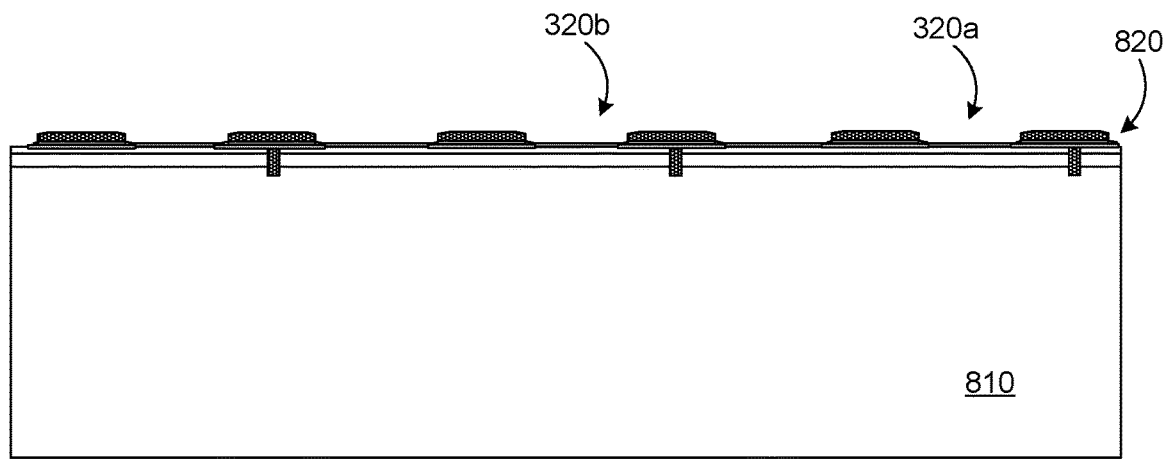
FIG. 8 is a diagram illustrating a portion of a gallium nitride (GaN) on Si wafer that can be used to produce semiconductor device assemblies.

FIG. 8 is a diagram illustrating a portion of a gallium nitride (GaN) on Si wafer that can be used to produce semiconductor device assemblies. The portion of the wafer (the wafer) shown in FIG. 8 can be used as a starting material for the manufacturing process flow illustrated in FIGS. 9A-9H, and for the manufacturing process flow illustrated in FIG. 10A-10F. For purposes of clarity, as well as consistency with the other example implementations described herein, the wafer shown in FIG. 8 includes a Si 111 substrate 810 with a GaN semiconductor device layer 820 (e.g., an AlGaN/GaN stack) in which the transistors 320a and 320b (as referenced with respect to FIGS. 3-6) are included.

Figure 9A:
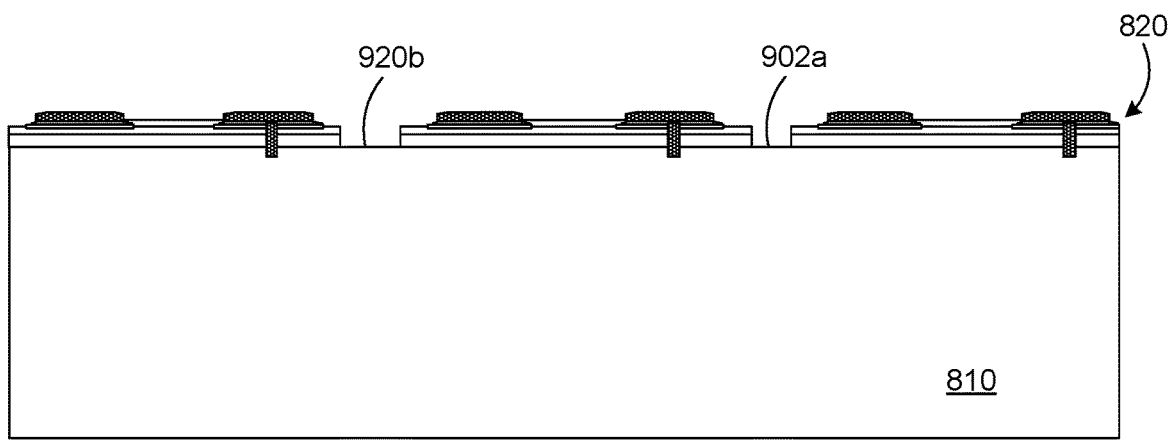
FIGS. 9A-9H are diagrams illustrating a manufacturing flow that can be used to produce a semiconductor device assembly from the GaN on Si wafer of FIG. 8, such as the semiconductor device assemblies of FIGS. 3, 4A and 6.

FIGS. 9A-9H are diagrams illustrating a manufacturing flow that can be used to produce a semiconductor device assembly, e.g., from the wafer of FIG. 8, such as the semiconductor device assemblies of FIGS. 3, 4A and 6. As shown in FIG. 9A, starting with the wafer of FIG. 8, photolithography and etch processes can be formed to define openings 902a and 902b in the semiconductor device layers. For instance, the operations of FIG. 9A can be performed to define an isolation trench pattern (e.g., trench 715a, trench 715b, etc.) in the semiconductor device layer 820. In this example, the opening 902a can correspond with a portion of an isolation trench disposed between the transistors 320a and 320b, while the opening 902b (e.g., which can be wider than the opening 902a), can correspond with a singulation cut line.

Figure 9B:
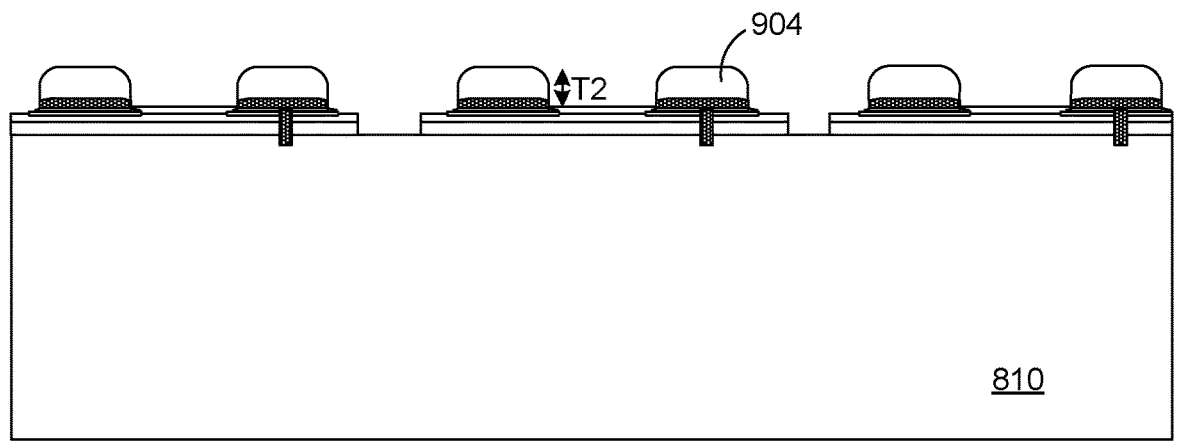
Figure 9C:
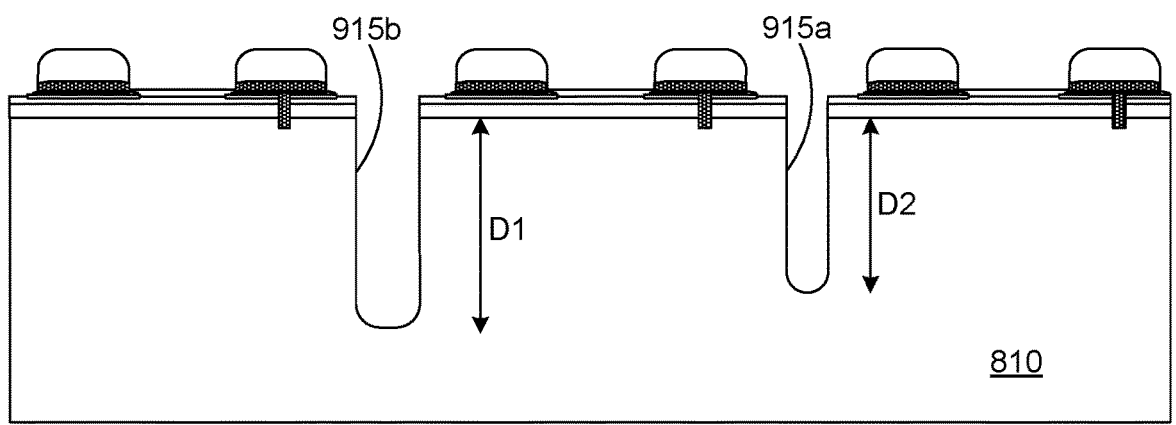

As shown in FIG. 9B, signal tracing, including forming solder bumps for flip chip configurations (e.g., having a thickness of T2 on the order of 40 µm), can be formed using plating, solder ball drop, or other approaches. Referring to FIG. 9C, a trench etch (e.g., a plasma etch) can be performed through the respective openings 902a and 902b of FIG. 9A to form trenches 915a and 915b in the substrate 810. As shown in FIG. 9C, because the opening 902b is wider than the opening 902a, the corresponding trench 915b is wider and (due plasma etch characteristics) deeper than the trench 915a corresponding with the opening 902a. As shown in FIG. 9C, the trench 915b can have a depth D1, which is greater than a depth D2 of the trench 915a. In some implementations, D2 can be on the order of 50 µm, while D1 can be on the order of 30 µm. In some implementations, D2 can be on the order of 80-100 µm, while D1 can be on the order of 50 µm.

Figure 9D:
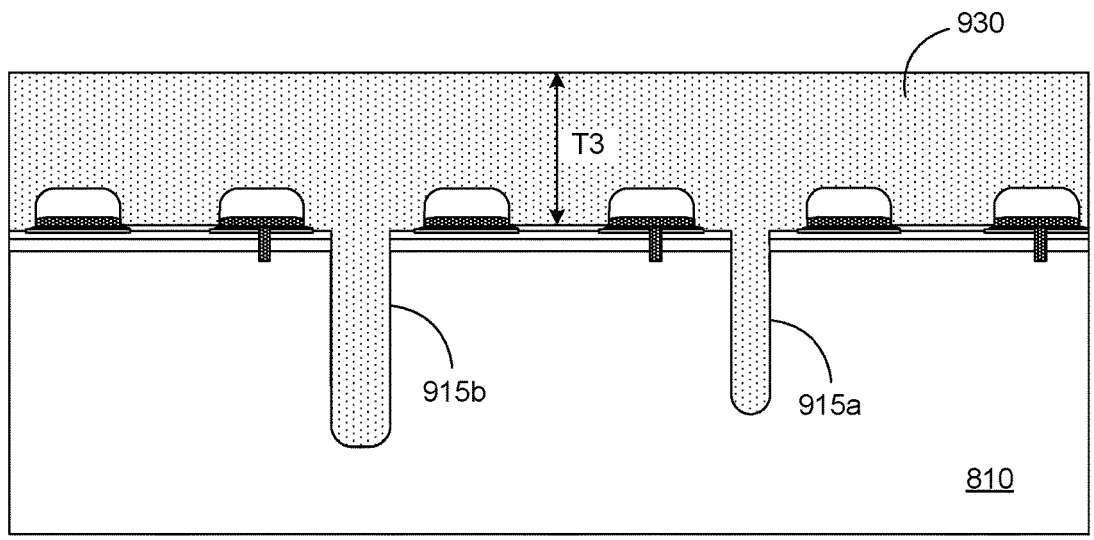
Figure 9E:
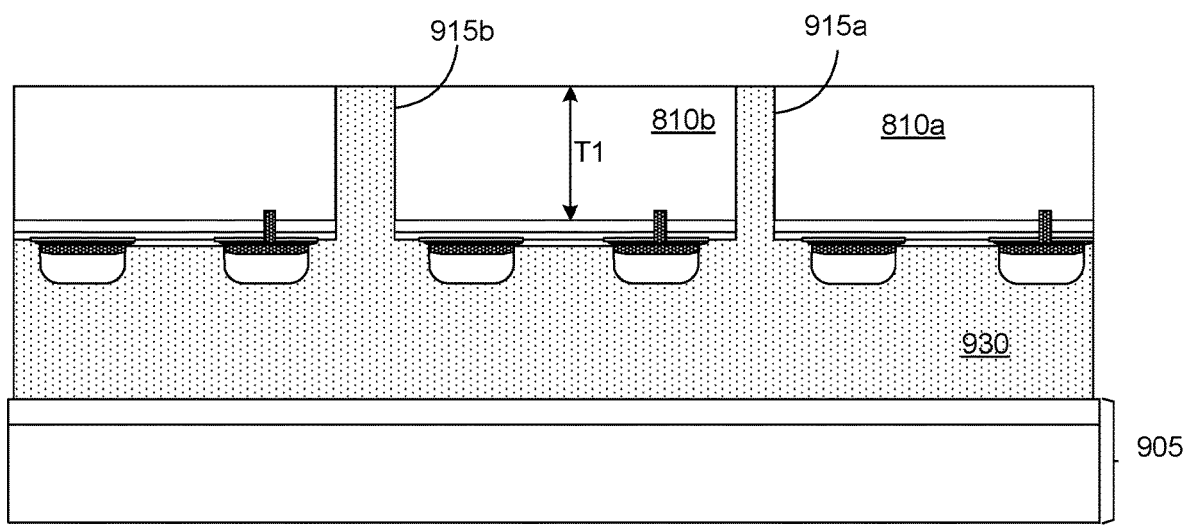

Referring to FIG. 9D, a compression molding operation can be performed to overmold a front side (top side) of the assembly being produced with a molding compound 930 having a thickness of T3 on the order of 120 µm, where the overmolding also fills the trenches 915a and 915b with the molding compound 930. Referring to FIG. 9E, the wafer from FIG. 9D can be inverted onto a (high-temperature) wafer tape or carrier 905 and a grind (back side grind) operation can be performed to thin the substrate 810 (where the back side is upward facing in FIG. 9D) and expose the molding compound 930 disposed in the isolation trench (e.g., in the trenches 915 and 915b) on the back side (bottom side) of the substrate 810. The backgrind, as also shown in FIG. 9E, can define a first substrate portion 810a and a second substrate portion 810b (e.g., due to the separation created by the isolation trench after backgrind). In some implementations, such as implementations for producing the assembly 600 of FIG. 6, the isolation trench (e.g., trenches 915a and 915b can first be filled (e.g., with a different dielectric material than the molding compound 930), where the other dielectric material can be planarized prior to performing a top side overmolding operation, such as in FIG. 9D.

Figure 9F:
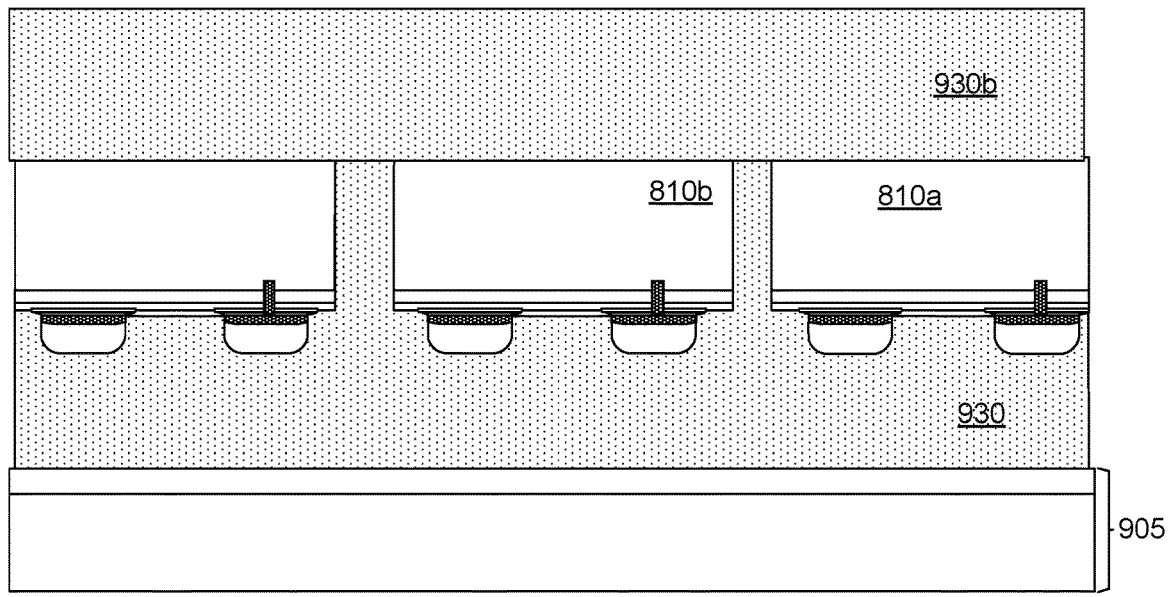
Figure 9G:
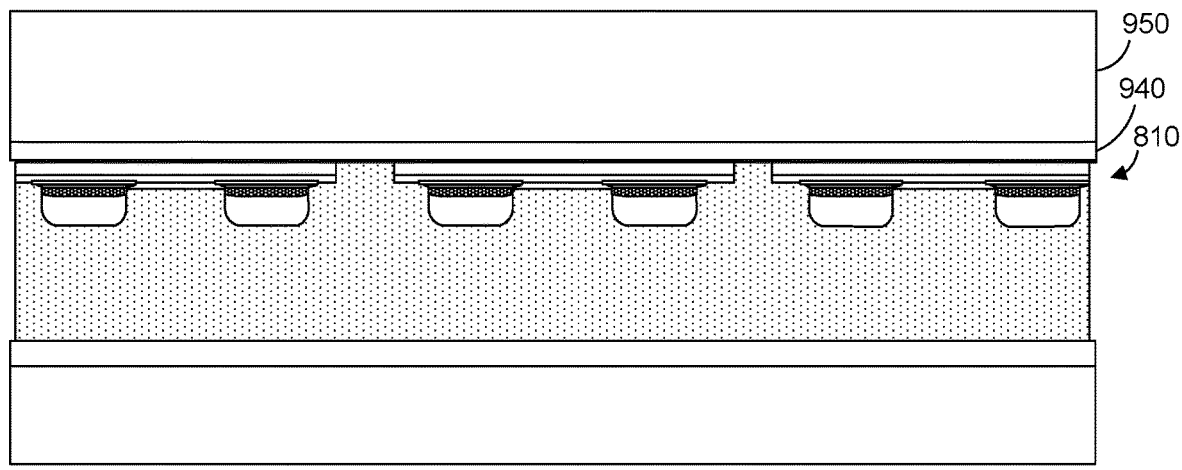

FIGS. 9F and 9G illustrate two parallel processes that can follow the operations of FIG. 9E. Referring to FIG. 9F, a back-side overmold operation can be performed to encapsulate a back side of the assembly with a molding compound 930*b* (which can be a same, or a different molding compound than molding compound 930). As shown in FIG. 9G, rather than performing the overmold operation of FIG. 9F, a thermally conductive dielectric layer 940, such as a ceramic, a diamond coat, etc., as discussed herein, can be applied to (disposed on) coplanar surfaces the first substrate portion 810*a*, the second substrate portion 810*b* and the molding compound 930 on the back side of the assembly. For instance, a ceramic material (e.g., AlN) can be sputtered or aerosol deposited to form the thermally conductive dielectric layer. As also shown in FIG. 9G, a thermally conductive material 950 can be disposed on (coupled with) the thermally conductive dielectric layer. The thermally conductive material 950 can include a solder material, a heat slug, and/or a heat sink (or other thermal dissipation appliance, such as a cooling jacket).

Figure 9H:
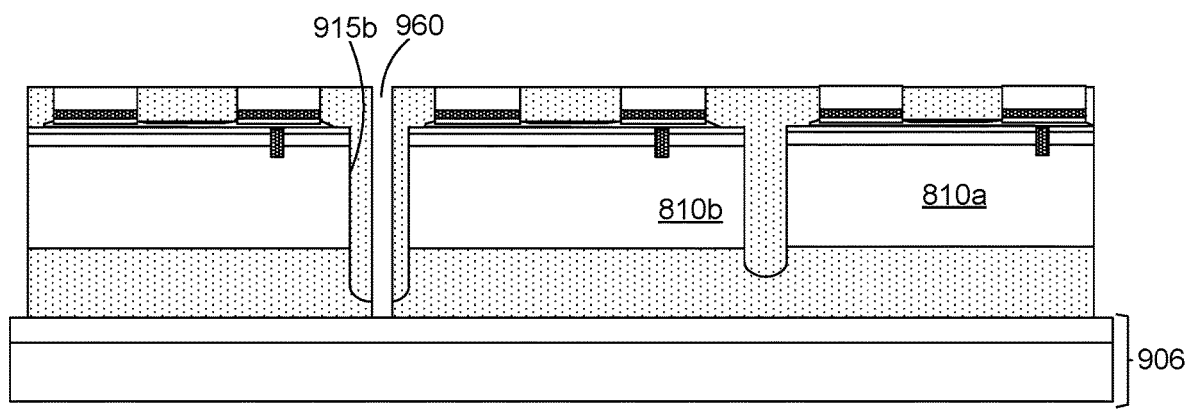

Referring to FIG. 9H, the wafer from either FIG. 9F or 9G can be coupled to a dicing tape 906 and a saw, laser, plasma etch can be used to form singulation cuts 960, to singulate the produced assembly from a wafer, or other assemblies. The singulated assembly can then be removed from the dicing tape for further processing, such assembly finish operations, attachment to conductive clips, electrical testing, etc.

Figure 10A:
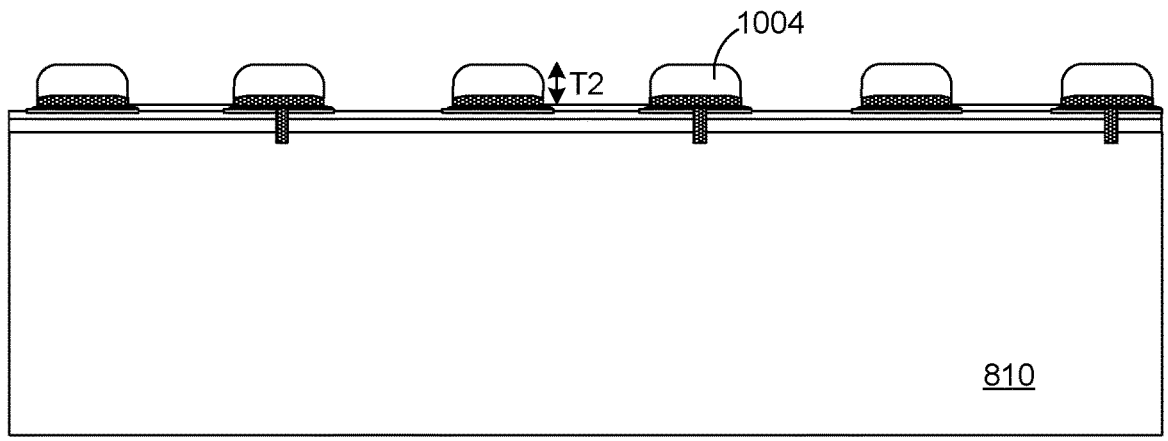
FIGS. 10A-10F are diagrams illustrating a manufacturing flow that can be used to produce a semiconductor device assembly from the GaN on Si wafer of FIG. 8, such as the semiconductor device assembly of FIG. 5.
Figure 10B:
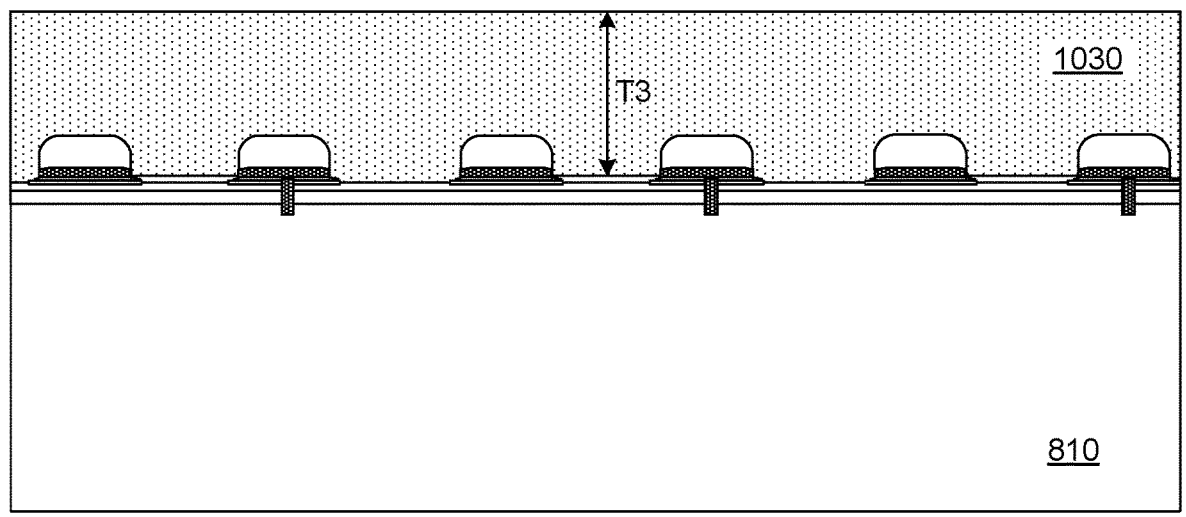
Figure 10C:
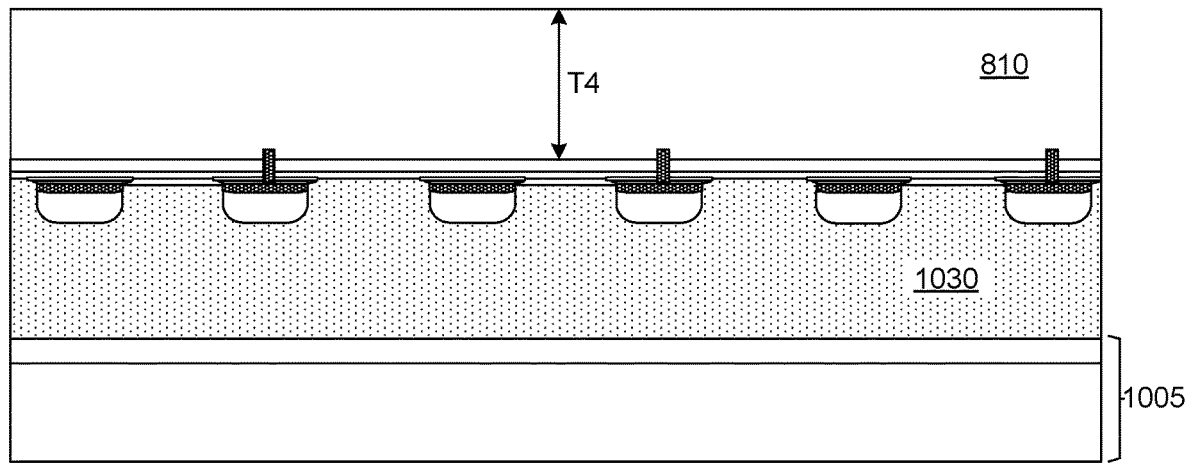
Figure 10D:
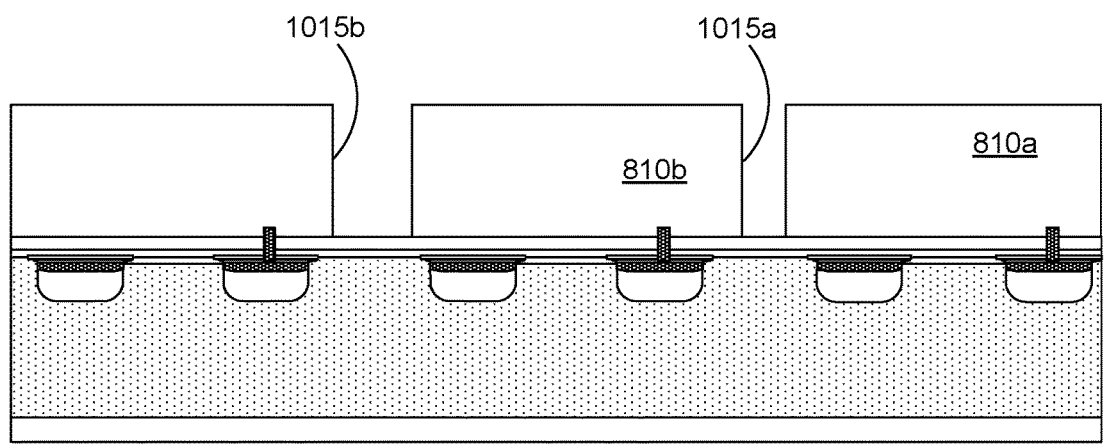

FIGS. 10A-10F are diagrams illustrating a manufacturing flow that can be used to produce a semiconductor device assembly, e.g., from the wafer of FIG. 8, such as the semiconductor device assembly of FIG. 4. As shown in FIG. 10A, similar to FIG. 9B, starting with the wafer of FIG. 8, signal tracing, including forming solder bumps for flip chip configurations, can be formed using plating, solder ball drop, or other approaches. Referring to FIG. 10B, a compression molding operation can be performed to overmold a front side (top side) of the assembly being produced with a molding compound 1030. Referring to FIG. 10C the wafer from FIG. 10B can be inverted onto a (high-temperature) wafer tape or carrier 1005 and a grind (back side grind) operation can be performed to thin the substrate 810 (where the back side is upward facing in FIG. 9D) to a thickness of T4. In some implementations, T4 can be on the order of 100 µm. Referring to FIG. 10D, a silicon etch process (e.g., a plasma etch) can be performed to form the trenches 1015*a* and 1015*b*, which can be part of an isolation trench of the assembly being produced, such as using the techniques described herein.

Figure 10E:
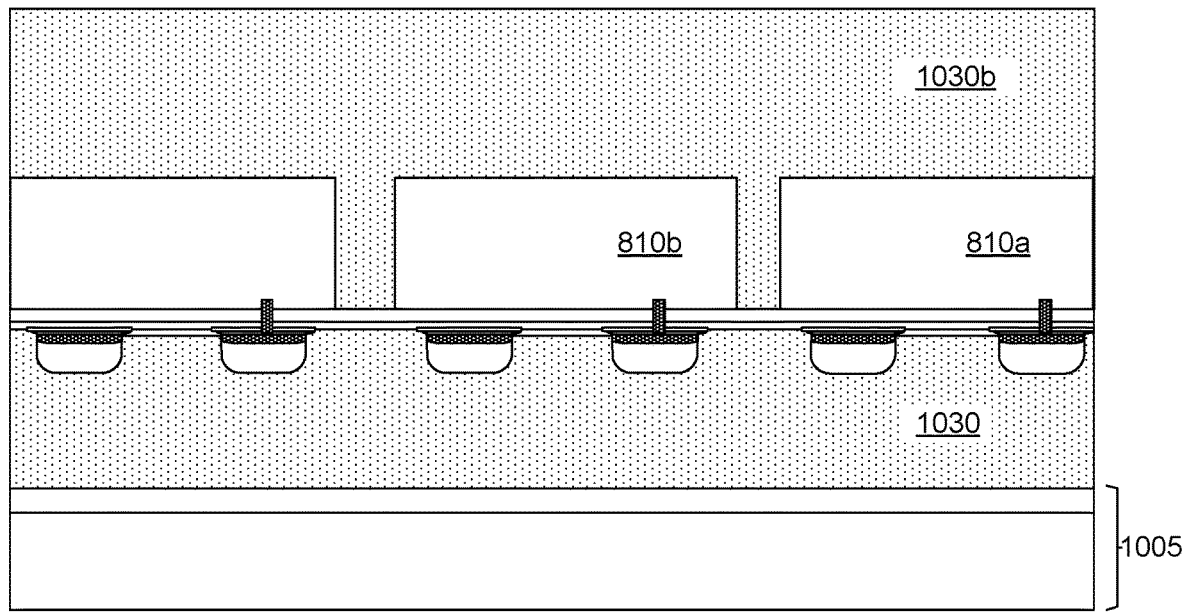
Figure 10F:
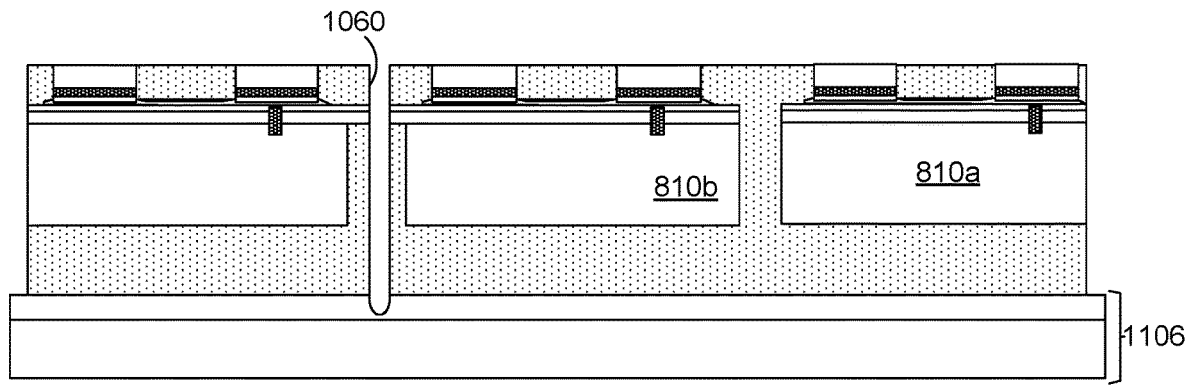

Referring to FIG. 10E, an overmold operation can be performed, and a back grind process can be performed to produce a back side profile (structure, arrangement, etc.) of the assembly of FIG. 10E that corresponds with the back side arrangement of the assembly shown in FIG. 9E. The processes of FIG. 9G could then be performed in conjunction with the manufacturing process of FIGS. 10A-10F to form layers such as the thermally conductive dielectric layer 940 and/or the thermally conductive material 950. For instance, referring to FIG. 10F, the wafer from FIG. 10E (or alternatively the wafer of FIG. 10E, modified as indicated above to include layers such as the thermally conductive dielectric layer 940 and/or the thermally conductive material 950), can be coupled to a dicing tape 1006 and a saw, laser, or plasma etch can be used to form singulation cuts 1060, to singulate the produced assembly from a wafer, or other assemblies. The singulated assembly can then be removed from the dicing tape for further processing, such assembly finish operations, attachment to conductive clips, electrical testing, etc.

In some implementations, a method for producing a semiconductor device assembly can include forming a first semiconductor device stack on a first portion of a semiconductor substrate. The method can also include forming a second semiconductor device stack on a second portion of the semiconductor substrate. The semiconductor substrate can be a substrate that excludes a buried oxide layer. The method can further include forming an isolation trench having a dielectric material disposed therein. The isolation trench can be disposed between the first portion of the semiconductor substrate and the second portion of the semiconductor substrate. The isolation trench can electrically isolate the first portion of the semiconductor substrate from the second portion of the semiconductor substrate.

Implementations can include one or more of the following features. For instance, the isolation trench can be formed such that is further disposed between the first semiconductor device stack and the second semiconductor device stack. The first semiconductor device stack can include a first gallium-nitride (GaN) transistor. The second semiconductor device stack can include a second GaN transistor. The semiconductor substrate can be a silicon substrate.

The isolation trench can be formed such that it is disposed around the first portion of the semiconductor substrate and around second portion of the semiconductor substrate. The isolation trench can be formed such that it is further disposed around the first semiconductor device stack and disposed around the second semiconductor device stack.

The dielectric material can include a molding compound. The molding compound can also be disposed on at least a portion of the first semiconductor device stack; and at least a portion of the second semiconductor device stack. The dielectric material can include at least one of an oxide material, a nitride material, an organic material, or a ceramic material.

The first semiconductor device stack can be disposed on a first surface of the first portion of the semiconductor substrate. The second semiconductor device stack can be disposed on a first surface of the second portion of the semiconductor substrate. The method can include forming a thermally conductive dielectric layer disposed on a second surface of the first portion of the semiconductor substrate opposite the first surface of the first portion of the semiconductor substrate; on a second surface of the second portion of the semiconductor substrate opposite the first surface of the second portion of the semiconductor substrate; and on a surface of the dielectric material of the isolation trench that is coplanar with the second surface of the first portion of the semiconductor substrate and coplanar with the second surface of the second portion of the semiconductor substrate. The thermally conductive dielectric layer can include at least one of a nitride ceramic material; or a diamond coat material. The thermally conductive dielectric layer can be a deposited material.

The first semiconductor device stack can be disposed on a first surface of the first portion of the semiconductor substrate. The second semiconductor device stack can be disposed on a first surface of the second portion of the semiconductor substrate. The method can include molding the semiconductor device assembly with a molding compound, such that the molding compound is disposed on a second surface of the first portion of the semiconductor substrate opposite the first surface of the first portion of the semiconductor substrate; on a second surface of the second portion of the semiconductor substrate opposite the first surface of the second portion of the semiconductor substrate; and on a surface of the dielectric material of the isolation trench that is coplanar with the second surface of the first portion of the semiconductor substrate and coplanar with the second surface of the second portion of the semiconductor substrate.

The semiconductor device assembly of can be formed as a flip-chip semiconductor assembly. The method can include singulating the semiconductor device assembly along a portion of the isolation trench.

In some implementations, a method for producing a semiconductor device assembly can include forming a first semiconductor device stack on a first portion of a semiconductor substrate. The method can also include forming a second semiconductor device stack on a second portion of the semiconductor substrate. The semiconductor substrate can exclude a buried oxide layer. The method can further include forming an isolation trench having a dielectric material disposed therein. The isolation trench can be disposed between the first portion of the semiconductor substrate and the second portion of the semiconductor substrate, and between the first semiconductor device stack and the second semiconductor device stack. The isolation trench can electrically isolate the first portion of the semiconductor substrate from the second portion of the semiconductor substrate. The isolation trench can also electrically isolate the first semiconductor device stack from the second semiconductor device stack.

In some implementations, a method for producing a semiconductor device assembly can include forming, in a semiconductor device layer disposed on a semiconductor substrate, a first semiconductor device. The method can also include forming a second semiconductor device in the semiconductor device layer. The semiconductor substrate can exclude a buried oxide layer. The method can also include forming an isolation trench having a dielectric material disposed therein. The isolation trench can be disposed between the first portion of the semiconductor substrate and the second portion of the semiconductor substrate. The isolation trench can electrically isolate the first portion of the semiconductor substrate from the second portion of the semiconductor substrate. The semiconductor device layer can exclude the isolation trench.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, Si, GaAs, SiGe, GaN, SiC, $Ga_2O_3$, as discussed herein, as well as other technologies.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device assembly comprising:
   a thermally conductive dielectric material;
   a first portion of a semiconductor substrate disposed on a surface of the thermally conductive dielectric material;
   a second portion of the semiconductor substrate disposed on the surface of the thermally conductive dielectric material, the semiconductor substrate excluding a buried oxide layer;
   a first semiconductor device stack disposed on the first portion of the semiconductor substrate opposite the thermally conductive dielectric material;
   a second semiconductor device stack disposed on the second portion of the semiconductor substrate opposite the thermally conductive dielectric material, the second semiconductor device stack being electrically coupled with the first semiconductor device stack; and
   an isolation trench having a dielectric material disposed therein, the isolation trench being defined in the semiconductor substrate between the first portion of the semiconductor substrate and the second portion of the semiconductor substrate, the isolation trench terminating at the surface of the thermally conductive dielectric material and electrically isolating the first portion of the semiconductor substrate from the second portion of the semiconductor substrate.

2. The semiconductor device assembly of claim 1, wherein the isolation trench is disposed between the first semiconductor device stack and the second semiconductor device stack.

3. The semiconductor device assembly of claim 1, wherein:
   the first semiconductor device stack includes a first gallium-nitride (GaN) transistor;
   the second semiconductor device stack includes a second GaN transistor; and
   the semiconductor substrate is a silicon substrate.

4. The semiconductor device assembly of claim 1, wherein the isolation trench is disposed around the first portion of the semiconductor substrate and around the second portion of the semiconductor substrate.

5. The semiconductor device assembly of claim 4, wherein the isolation trench is further disposed around the first semiconductor device stack and disposed around the second semiconductor device stack.

6. The semiconductor device assembly of claim 1, wherein the dielectric material disposed in the isolation trench includes a molding compound, the molding compound being further disposed on:
   at least a portion of the first semiconductor device stack; and
   at least a portion of the second semiconductor device stack.

7. The semiconductor device assembly of claim 1, wherein the dielectric material disposed in the isolation trench includes at least one of an oxide material, a nitride material, an organic material, or a ceramic material.

8. The semiconductor device assembly of claim 1, wherein:
   the first semiconductor device stack is disposed on a first surface of the first portion of the semiconductor substrate;
   the second semiconductor device stack is disposed on a first surface of the second portion of the semiconductor substrate; and
   the thermally conductive dielectric material is disposed on:
      a second surface of the first portion of the semiconductor substrate opposite the first surface of the first portion of the semiconductor substrate;
      a second surface of the second portion of the semiconductor substrate opposite the first surface of the second portion of the semiconductor substrate; and
      a surface of the dielectric material disposed in the isolation trench that is coplanar with the second surface of the first portion of the semiconductor substrate and coplanar with the second surface of the second portion of the semiconductor substrate.

9. The semiconductor device assembly of claim 8, wherein the thermally conductive dielectric material includes at least one of:
   a nitride ceramic material; or
   a diamond coat material.

10. The semiconductor device assembly of claim 8, wherein the thermally conductive dielectric material is a deposited material.

11. The semiconductor device assembly of claim 1, wherein the semiconductor device assembly is a flip-chip semiconductor assembly.

12. The semiconductor device assembly of claim 1, wherein the semiconductor device assembly is singulated along a portion of the isolation trench.

13. A semiconductor device assembly comprising:
   a first portion of a semiconductor substrate;
   a second portion of the semiconductor substrate, the semiconductor substrate excluding a buried oxide layer;
   a thermally conductive dielectric layer disposed on:
      a surface of the first portion of the semiconductor substrate; and
      a surface of the second portion of the semiconductor substrate, the surface of the second portion of the semiconductor substrate being coplanar with the surface of the first portion of the semiconductor substrate;
   a first semiconductor device stack disposed on the first portion of the semiconductor substrate opposite the thermally conductive dielectric layer;
   a second semiconductor device stack disposed on the second portion of the semiconductor substrate opposite the thermally conductive dielectric layer, the second semiconductor device stack being electrically coupled with the first semiconductor device stack; and
   an isolation trench defined in the semiconductor substrate and having a dielectric material disposed therein, the isolation trench terminating at the thermally conductive dielectric layer, the isolation trench being disposed:
      between the first portion of the semiconductor substrate and the second portion of the semiconductor substrate; and
      between the first semiconductor device stack and the second semiconductor device stack,
      the isolation trench electrically isolating the first portion of the semiconductor substrate from the second portion of the semiconductor substrate, and electrically isolating the first semiconductor device stack from the second semiconductor device stack.

14. The semiconductor device assembly of claim 13, wherein the dielectric material includes a molding compound, the molding compound being further disposed on:
   at least a portion of the first semiconductor device stack; and
   at least a portion of the second semiconductor device stack.

15. The semiconductor device assembly of claim 13, wherein the isolation trench is disposed around:
   the first portion of the semiconductor substrate;
   the second portion of the semiconductor substrate;
   the first semiconductor device stack; and
   the second semiconductor device stack.

16. The semiconductor device assembly of claim 13, wherein:
   the first semiconductor device stack includes a first gallium-nitride (GaN) transistor;
   the second semiconductor device stack includes a second GaN transistor; and
   the semiconductor substrate is a silicon substrate having a 111 crystal orientation.

\* \* \* \* \*